(12) United States Patent
Saheb et al.

(10) Patent No.: US 11,594,845 B2
(45) Date of Patent: Feb. 28, 2023

(54) ELECTRICAL CONNECTION SYSTEM COMPRISING A PRIMARY CONNECTION DEVICE AND A SECONDARY CONNECTION DEVICE

(71) Applicant: SAGEMCOM BROADBAND SAS, Rueil Malmaison (FR)

(72) Inventors: Nassim Saheb, Rueil Malmaison (FR); Hervé Lieven, Rueil Malmaison (FR); Yann Le Henanff, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 17/255,807

(22) PCT Filed: Jun. 19, 2019

(86) PCT No.: PCT/EP2019/066306
§ 371 (c)(1),
(2) Date: Dec. 23, 2020

(87) PCT Pub. No.: WO2020/002113
PCT Pub. Date: Jan. 2, 2020

(65) Prior Publication Data
US 2021/0281018 A1    Sep. 9, 2021

(30) Foreign Application Priority Data
Jun. 25, 2018   (FR) ...................................... 1855661

(51) Int. Cl.
*H01R 12/00*    (2006.01)
*H01R 13/6584*    (2011.01)
(Continued)

(52) U.S. Cl.
CPC ....... *H01R 13/6584* (2013.01); *H01R 12/737* (2013.01); *H01R 12/89* (2013.01)

(58) Field of Classification Search
CPC .......................... H05K 3/4092; H01R 23/7073
(Continued)

(56) References Cited

U.S. PATENT DOCUMENTS

| 4,836,791 | A | * | 6/1989 | Grabbe | .................. | H01R 12/00 |
|---|---|---|---|---|---|---|
| | | | | | | 439/79 |
| 5,145,381 | A | | 9/1992 | Volz | | |
| 2003/0161108 | A1 | | 8/2003 | Bright et al. | | |

FOREIGN PATENT DOCUMENTS

| DE | 3834182 A1 | 4/1990 |
|---|---|---|
| FR | 2508719 A1 | 12/1982 |
| WO | WO-2018049686 A1 | 3/2018 |

* cited by examiner

*Primary Examiner* — Phuong Chi Thi Nguyen
(74) *Attorney, Agent, or Firm* — Muncy, Geissler, Olds & Lowe, P.C.

(57) ABSTRACT

Electrical connection system comprising a primary connection device and a secondary connection device, the primary connection device comprising a shielded cap and primary conductive contacts which extend at least partially inside the shielded cap, the secondary connection device comprising a secondary electrical board which has a secondary mass surface, secondary conductive contacts which extend from an installation surface of the secondary electrical board which is surrounded by the secondary mass surface, and a resilient conductive material which is attached to the secondary mass surface, the electrical connection system being arranged so that the primary conductive contacts are electrically connected to the secondary electrical contacts inside the shielded cap and the shielded cap extends on the resilient conductive material by compressing it.

9 Claims, 6 Drawing Sheets

(51) Int. Cl.
*H01R 12/73* (2011.01)
*H01R 12/89* (2011.01)

(58) Field of Classification Search
USPC ........................................ 439/79–81, 95, 108
See application file for complete search history.

ELECTRICAL CONNECTION SYSTEM COMPRISING A PRIMARY CONNECTION DEVICE AND A SECONDARY CONNECTION DEVICE

The invention relates to the field of electrical connection systems comprising a primary connection device and a secondary connection device.

BACKGROUND OF THE INVENTION

Electrical equipment is frequently designed to comprise two electric circuit cards that are plugged together in releasable manner via an electrical connection system. In the electrical connection system, ground continuity between the two circuit cards is difficult to achieve in a manner that is reliable and repeatable.

It is appropriate to ensure that signals transmitted through the electrical connection system, and in particular signals that are fast, do not disturb the operation of components internal to the electrical equipment that incorporates the electrical connection system, or indeed components of external electrical equipment. By way of example, internal components and external electrical equipment may include radio receivers that are thus situated inside or outside the equipment in question and that might be disturbed by interference signals generated by fast signals transiting between the two circuit cards. The frequency band concerned then corresponds to the working band of the radio receivers (e.g. up to 6 gigahertz (GHz) for Wi-Fi radios).

However, protection against the propagation of the electromagnetic noise generated by the signals being conveyed depends on the quality of ground continuity.

In order to connect two circuit cards together, it is known to use a rigid ribbon provided at each of its ends with a connector, the rigid ribbon being shielded over its entire length and where it is fastened to the connectors. Such a rigid ribbon is expensive and complicated to use industrially.

Electrical connection systems similar to the system shown in FIG. 1 are also known for the purpose of connecting together a primary circuit card 1 and a secondary circuit card 2 in mutually orthogonal manner. The primary circuit card 1 has a male connector 3 for connecting in a female connector 4 of the secondary circuit card 2. The primary circuit card 1 includes a generally rigid primary shielding device 5, and the secondary circuit card 2 includes a secondary shielding device 6 comprising a plurality of shielded elements, each including a compliant portion. By way of example, the shielded elements may be mutually parallel fingers. At the time the primary circuit card 1 and the secondary circuit card 2 are connected together, the primary shielding device 5 slides on and rubs against the shielded elements of the secondary shielding device 6.

That solution presents a certain number of drawbacks. It is necessary to provide the primary shielding device 5 with a stroke over the shielded elements of the secondary shielding device 6 that presents a portion of sufficient length to ensure sufficient contact in the connected position. There also exist major constraints on the tolerance for manufacturing the shielded elements, since they need to be sufficiently compliant to enable the primary shielding device 5 to be inserted easily while simultaneously ensuring contact that is sufficient. Furthermore, continuity of contact is generally provided poorly or not at all in corner zones of the primary shielding device 5 and of the secondary shielding device 6. Finally, a potentially problematic wear phenomenon is frequently observed to occur at the interface between the primary shielding device 5 and the secondary shielding device 6.

OBJECT OF THE INVENTION

An object of the invention is to provide an electrical connection system that is compact, inexpensive, robust, and effective in providing ground continuity in reliable and repeatable manner.

SUMMARY OF THE INVENTION

In order to achieve this object, there is provided an electrical connection system comprising a primary connection device and a secondary connection device arranged to be connected together, the primary connection device including a shielded cover and primary conductive contacts that extend at least in part inside the shielded cover, the secondary connection device including a secondary electric circuit card presenting a secondary ground surface, secondary conductive contacts that extend from an implantation surface of the secondary circuit card, which implantation surface is surrounded by the secondary ground surface, and a compliant conductive member fastened on the secondary ground surface, the electrical connection system being arranged in such a manner that, when the primary connection device and the secondary connection device are connected together, the primary conductive contacts are electrically connected to the secondary conductive contacts inside the shielded cover and the shielded cover extends over the compliant conductive member while compressing it.

The electrical connection system of the invention is compact. No wear phenomenon is observed. By means of the shielded cover and the compliant conductive member that is compressed by the shielded cover, total shielding is obtained that is very reliable and without ground discontinuity. Making contact by compression serves to obtain shielding that is very effective regardless of the manufacturing tolerances for the various elements making up the electrical connection system.

There is also provided electrical equipment comprising an electrical connection system as described above, a primary circuit connected to the primary connection device, and a secondary circuit connected to the secondary connection device.

There is also provided a secondary connection device comprising a secondary electric circuit card presenting a secondary ground surface, secondary conductive contacts that extend orthogonally to the secondary circuit card from an implantation surface of the secondary circuit card, which implantation surface is surrounded by the secondary ground surface, and a compliant conductive member fastened on the secondary ground surface.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
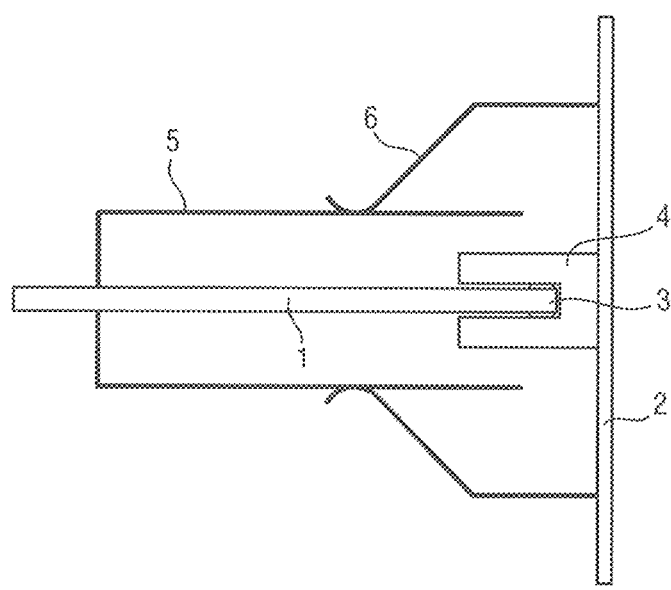
FIG. 1 shows an electrical connection system of the prior art.
Figure 2:
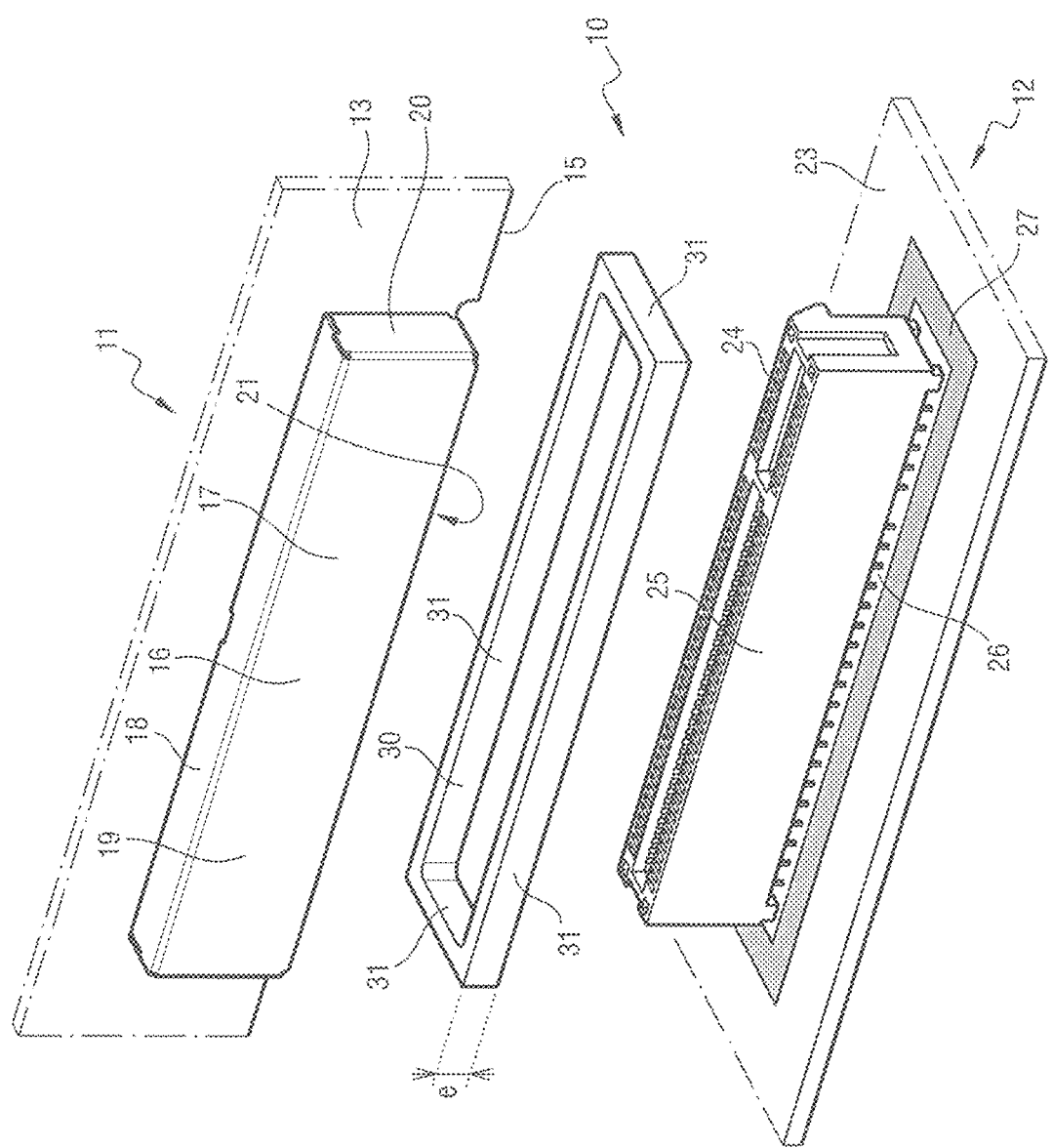
FIG. 2 is a partially cutaway face view in perspective of the electrical connection system of the invention, the primary connection device and the secondary connection device not being connected together.
Figure 3:
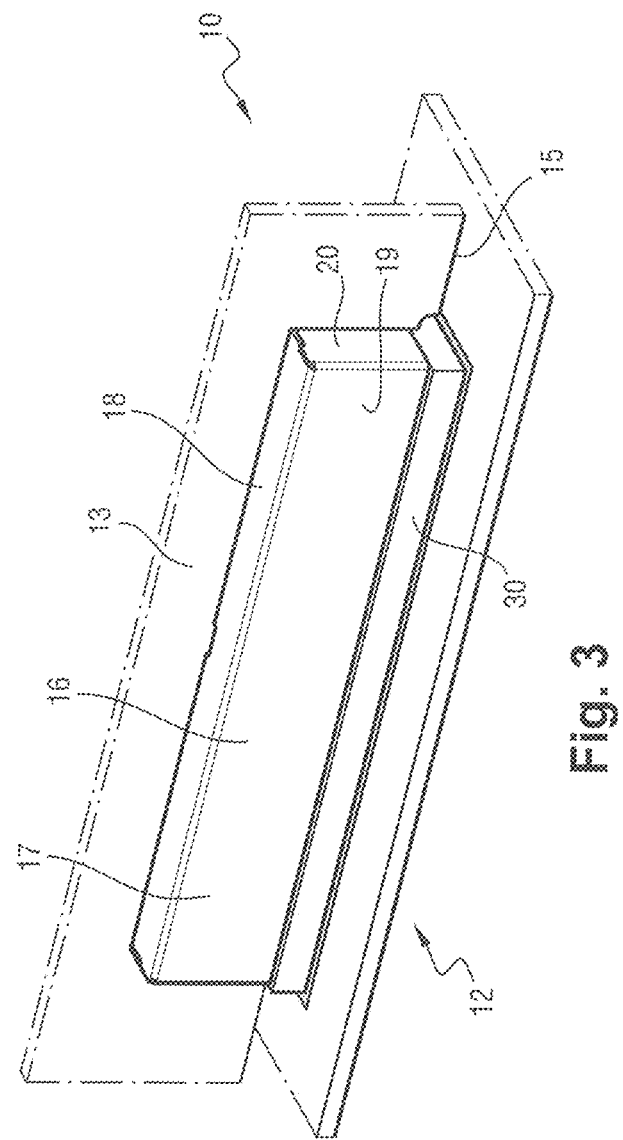
FIG. 3 is a face view in perspective of the electrical connection system of the invention, the primary connection device and the secondary connection device being connected together.
Figure 4:
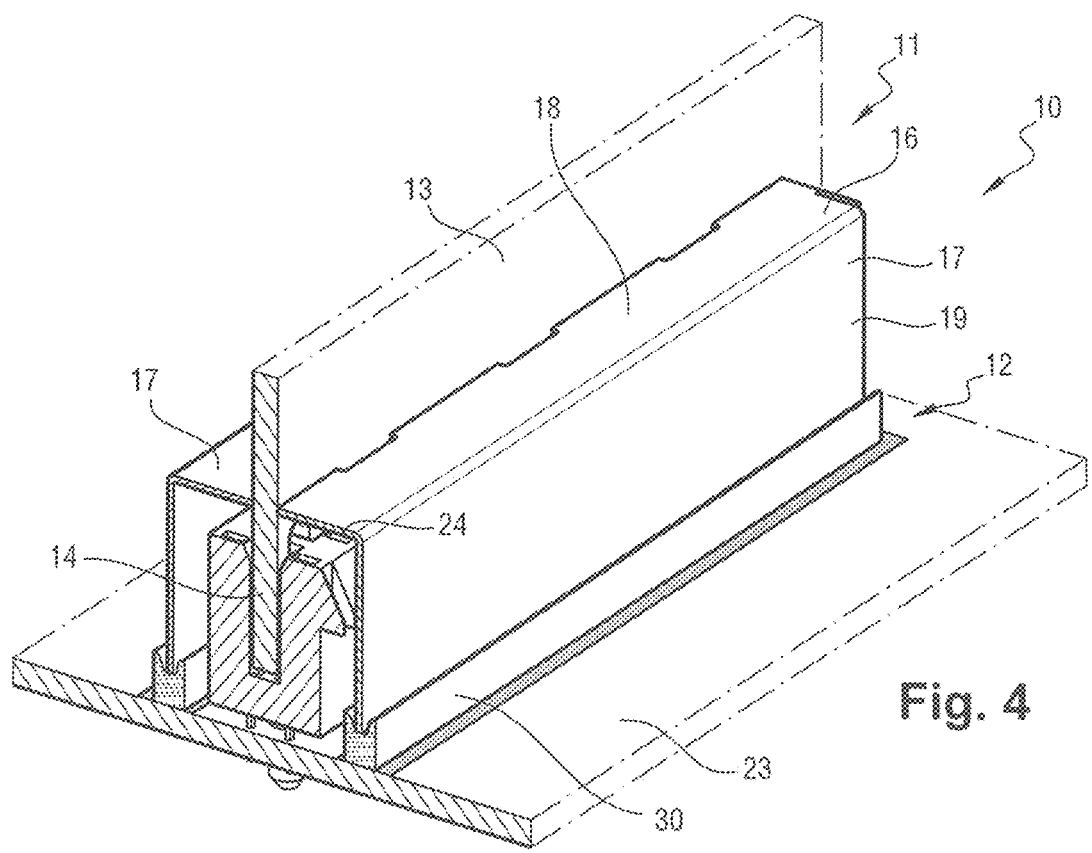
FIG. 4 is a lateral view in perspective of the electrical connection system of the invention, the primary connection device and the secondary connection device being connected together.
Figure 5:
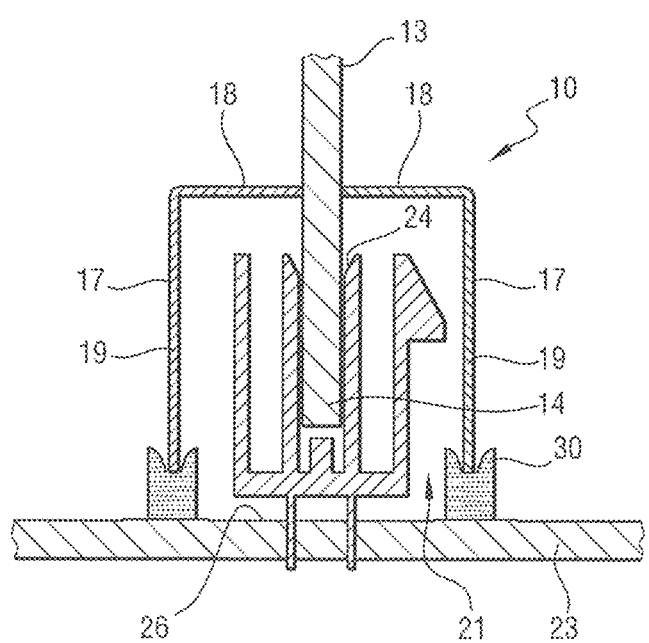
FIG. 5 is a two-dimensional section view on a plane perpendicular both to a primary circuit card and to a secondary circuit card, and showing the electrical connection system of the invention, the primary connection device and the secondary connection device being connected together.

With reference to FIGS. 2 to 5, the electrical connection system 10 of the invention comprises a primary connection device 11 and a secondary connection device 12.

The primary connection device 11 is connected to a primary circuit. The secondary connection device 12 is connected to a secondary circuit.

The primary connection device 11 and the secondary connection device 12 are arranged to be connected together in releasable manner so as to enable the primary circuit and the secondary circuit to be connected together. The primary circuit and the secondary circuit can thus exchange signals (power, data, etc.) via the electrical connection system 10.

The primary circuit, the secondary circuit, and the electrical connection system 10 are to be incorporated in a single piece of electrical equipment, the primary connection device 11 and the secondary connection device 12 then being connected together.

The primary connection device 11 firstly comprises a primary electric circuit card 13. In this example, the primary circuit is arranged on the primary circuit card 13.

The primary circuit card 13 has primary conductive contacts 14 suitable for passing signals. The primary conductive contacts 14 extend parallel to the primary circuit card 13 at an edge 15 of the primary circuit card 13.

The primary connection device 11 further comprises a rigid shielded cover 16 made of an electrically conductive material, e.g. copper or steel.

In this example, the shielded cover 16 comprises two half-shells 17, each extending on one side of the primary circuit card 13.

Each half-shell 17 has a top face 18 that is orthogonal to the primary circuit card 13 and parallel to the edge 15, a main face 19 parallel to the primary circuit card 13, and two lateral faces 20, each of which is orthogonal to the primary circuit card 13 and to the edge 15.

Taken as a whole, the shielded cover 16 thus forms a rectangular shielded box that is open only via an empty open face 21 parallel to the top faces 18.

The shielded cover 16 projects in part from the primary circuit card 13, i.e. portions of the main face 19 and of the lateral faces 20 of each half-shell 17 project beyond the edge of the primary circuit card 13.

The shielded cover 16 is fastened to the primary circuit card 13. In this example, the top face 18 and the lateral faces 20 of each half-shell 17 of the shielded cover 16 are fastened on respective faces of the primary circuit card 13, specifically by reflow soldering. Naturally, some other fastening means could be used: another type of soldering, clip-fastening, screw-fastening, etc.

Advantageously, the top face 18 and the lateral faces 20 of each half-shell 17 are each fastened against a primary ground surface, each primary ground surface extending over a respective face of the primary circuit card 13. By way of example, each primary ground surface is a metal surface that is bare (i.e. not varnished and not coated).

The primary conductive contacts 14 extend at least in part inside the shielded cover 16, and in this example they extend inside it entirely.

The secondary connection device 12 firstly comprises a secondary electric circuit card 23. In this example, the secondary circuit is arranged on the secondary circuit card 23.

The secondary circuit card 23 has secondary conductive contacts 24 suitable for passing signals. The secondary conductive contacts 24 extend orthogonally to the secondary circuit card 23.

The secondary conductive contacts 24 are arranged in a secondary connector 25, specifically a connector for fast signals, and they extend from an implantation surface 26 of the secondary circuit card 23.

The secondary circuit card 23 has a secondary ground surface 27 that is a bare metal surface. The secondary ground surface 27 is in the form of a wide track that extends on one of the faces of the secondary circuit card 23 so as to form a rectangle.

The secondary ground surface 27 surrounds the implantation surface 26 and thus surrounds the secondary conductive contacts 24.

The secondary connection device 12 further comprises a compliant conductive member 30.

In this example, the compliant conductive member 30 forms a rectangular profile, i.e. it is in the form of a rectangular ring.

The compliant conductive member 30 has four branches 31, each of rectangular section, and together they surround an internal cavity of rectangular section. In this example, the thickness e of each branch 31 is equal to 3 mm.

In this example, the compliant conductive member 30 comprises a conductive foam.

The compliant conductive member 30 is fastened on the secondary ground surface 27, in this example by means of a conductive adhesive. Naturally, some other fastening means could be used: clip fastening, screw fastening, etc.

The secondary connector 25 and the secondary conductive contacts 24 thus have their bases extending inside the internal cavity of the compliant conductive member 30.

Thus, when the primary connection device 11 and the secondary connection device 12 are connected together, the secondary connector 25 penetrates into the shielded cover 16 via its empty open face 21. The primary conductive contacts 14 and the secondary conductive contacts 24 are then in contact with one another, thereby enabling signals to be conveyed between the primary connection device 11 and the secondary connection device 12, and thus between the primary circuit and the secondary circuit. Although in this example the electrical connection is made by contact, it should be observed that it is equally possible for the connection to be made by contactless coupling.

The rigid shielded cover 16 then extends over the compliant conductive member 30, compressing it. Good continuity of shielding ground is thus obtained all around the outline of the shielded cover 16, i.e. around all of the free edges of the main faces 19 and of the lateral faces 20 of both of the half-shells 17 of the shielded cover 16. Continuity is also ensured at the corners of the shielded cover 16 and of the compliant conductive member 30.

The shielded cover 16 (and thus, where present, the primary ground surface) is thus in completely continuous electrical contact with the compliant conductive member 30 and with the secondary ground surface 27.

Figure 6:
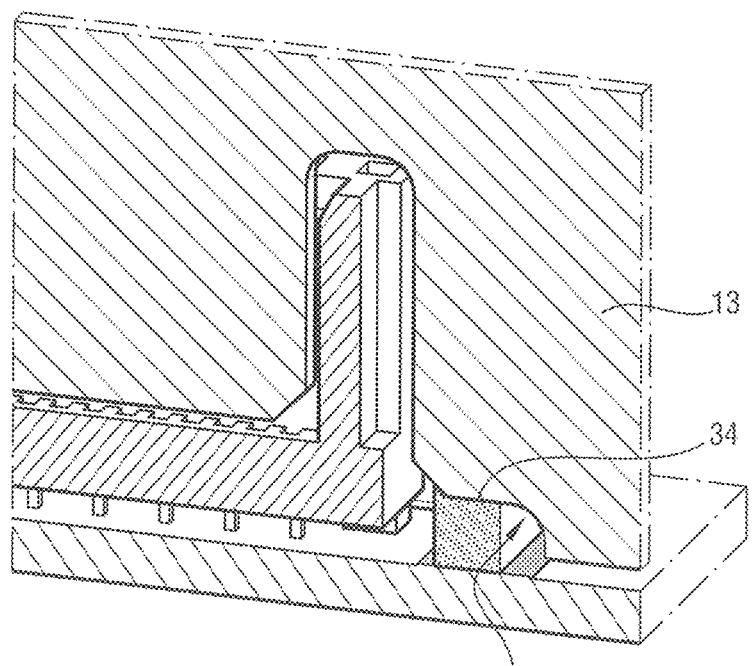
FIGS. 6 and 7 are detail views in perspective of an edge of the primary circuit card including a notch, the primary connection device and the secondary connection device being connected together.
Figure 7:
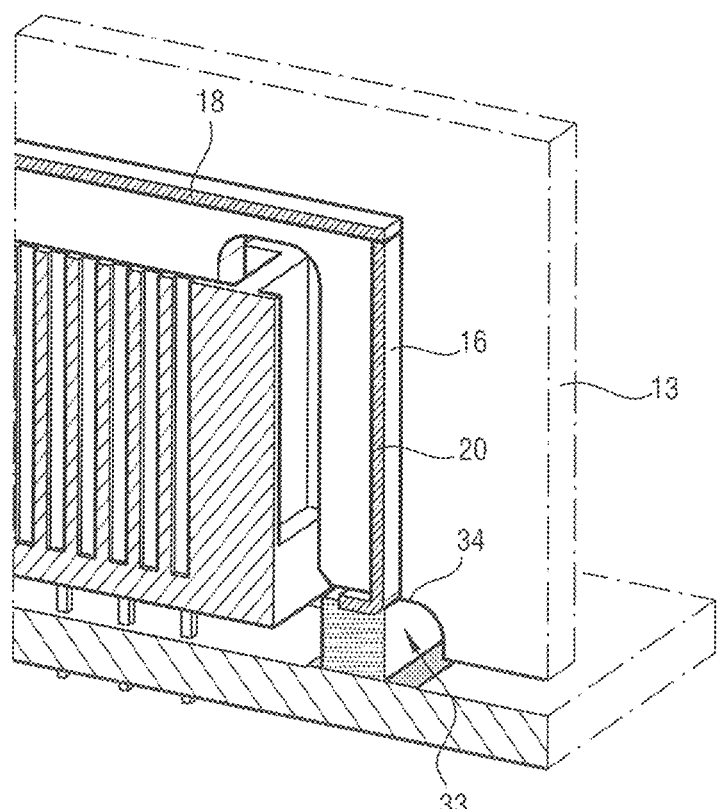

In FIGS. 6 and 7, it can be observed that the edge 15 of the primary circuit card 13 presents at least one notch 33. In this example, the edge 15 of the primary circuit card has two notches 33. Each notch 33 is situated in the edge 15 in the proximity of a contact surface between the shielded cover 16 and the primary circuit card 13, i.e. in the edge 15 in the proximity of the free edges of the lateral faces 20 of the half-shells 17 of the shielded cover 16. Each notch 33 is formed from free edges of two lateral faces 20 situated on either side of the primary circuit card 13, i.e. within each notch 33, the edge face 34 of the primary circuit card 13 comes flush with the free edges of two lateral faces 20 situated on either side of the primary circuit card 13.

In the notches 33, the edge face 34 of the primary circuit card 13 is coated in a metal material that is connected to the ground plane of the primary circuit card 13.

As a result of the notches 33, when the primary connection device 11 and the secondary connection device 12 are connected together, the edge 15 of the primary circuit card 13 can bear against the secondary circuit card 23 while limiting the extent to which the compliant conductive member 30 is compressed by the edge 15.

This spares the compliant conductive member 30 from any excessive stresses created by the edge face 34 of the primary circuit card 13. Since, within each notch 33, the edge face 34 is located at the same level as the shielded cover 16, i.e. at the same level as the free edges of the lateral faces 20 of the half-shells 17, the edge face 34 compresses the compliant conductive member 30 in the same manner as the remainder of the shielded cover 16. Furthermore, because of contact between the metal material coating the edge face 34 and the compliant conductive member 30, any leaks of radiation from this singular zone are limited (or even eliminated).

It should be observed that the compliant conductive member 30 is conductive in order to ensure shielding ground continuity of the electrical connection system 10, and it is compliant in order to enable the shielded cover 16 of the primary circuit card 13 to be in contact with the compliant conductive member 30 all around the outline of the shielded cover 16.

The foam used must be sufficiently elastic to avoid being subjected to any permanent deformation so that contact can always be established between the shielded cover 16 and the foam (and thus between the shielded cover 16 and the secondary ground surface 27 of the secondary circuit card 23). In this example, the foam that is selected presents a compression ratio of 33%. Since the compliant conductive member 30 has a thickness of 3 millimeters (mm), a tolerance of 1 mm is obtained for the stroke of the shielded cover 16. In order to ensure contact all around the outline, the compression ratio must not be too small, and it must not be too large, firstly to avoid deforming the secondary circuit card 23 and secondly to avoid losing compliance of the foam.

The foam that is selected makes it possible to achieve shielding effectiveness greater than 100 decibels (dB) for signals at frequencies up to 8 GHz through a highly conductive material.

The electrical connection system 10 between the primary circuit card 13 and the secondary circuit card 23 is put under stress by the spring force of the foam. This force tends to move the primary circuit card 13 away from the secondary circuit card 23 and thus to disconnect the primary circuit card 13 from the secondary circuit card 23. The stiffness of the foam needs to be determined so as to take this parameter into account.

Figure 8:
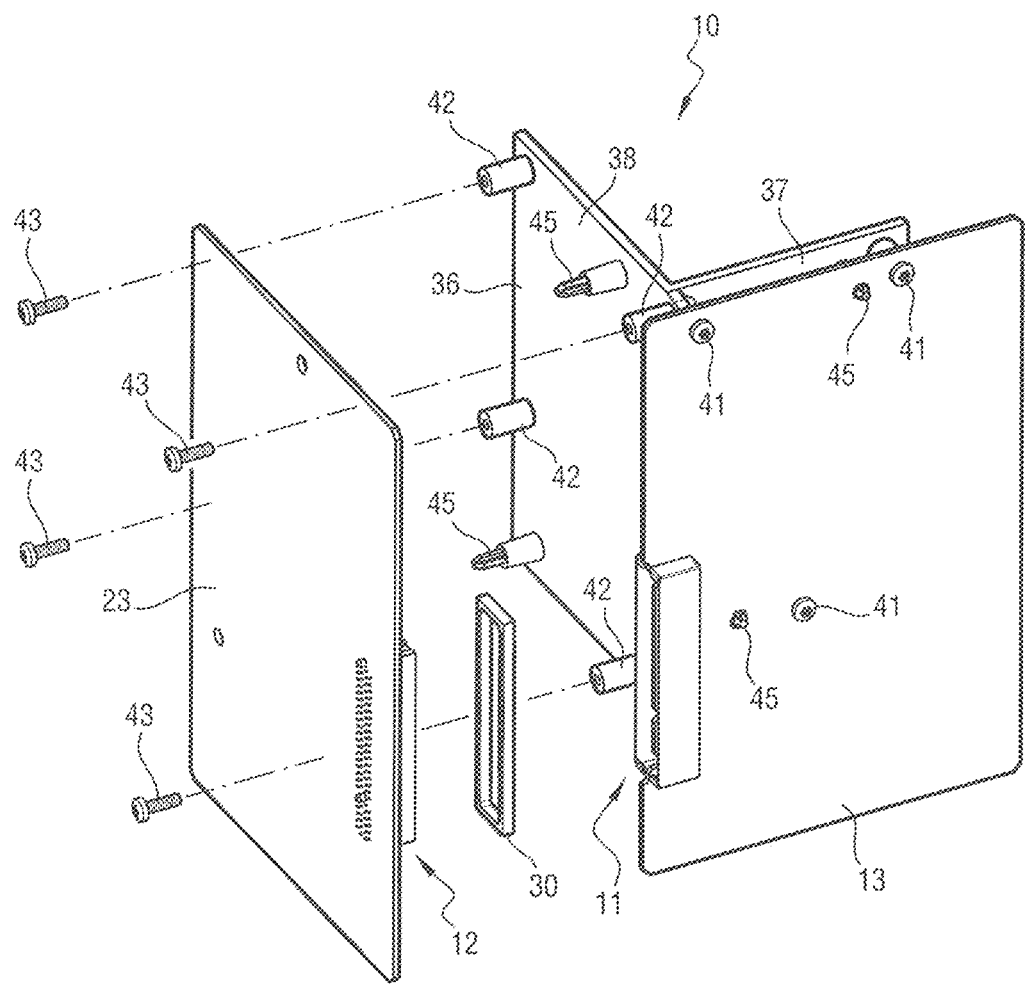
FIG. 8 is a bottom view in perspective of the electrical connection system of the invention, the primary connection device and the secondary connection device being connected together, and with mechanical holder means being shown.

Advantageously (but not necessarily), and with reference to FIG. 8, the electrical connection system 10 may further include mechanical holder means for holding the primary circuit card 13 mechanically to the secondary circuit card 23.

In this example, the mechanical holder means comprise a holder device 36 comprising a primary plate 37 and a secondary plate 38 that are mutually orthogonal. The holder device 36 is for positioning against the primary circuit card 13 and the secondary circuit card 23 inside the space defined by the primary circuit card 13 and the secondary circuit card 23.

The primary plate 37 is arranged to be fastened to the primary circuit card 13, and for this purpose it includes tapped studs 40 on its outside face. The primary plate 37 is fastened to the primary circuit card 13 by means of screws 41 passed through the primary circuit card 13 in order to be screwed into the tapped studs 40.

The secondary plate 38 is arranged to be fastened to the secondary circuit card 23, and for this purpose it includes tapped studs 42 on its outside face. The secondary plate 38 is fastened to the secondary circuit card 23 by means of screws 43 passed through the secondary circuit card 23 in order to be screwed into the tapped studs 42.

The holder device further comprises guides 45 in the form of male pegs that are inserted in holes formed in the primary circuit card 13 and in the secondary circuit card 23. These guides 45 enable the primary circuit card 13 and the secondary circuit card 23 to be positioned accurately relative to each other.

Thus, the holder device enables the primary circuit card 13 and the secondary circuit card 23 to be held and positioned accurately relative to each other, and enables their connected position to be guaranteed.

In this example, the holder device is made of a metal material and it also acts as a heatsink that dissipates the heat produced by the components of the primary circuit and of the secondary circuit.

It should be observed that the holder device could be made in some other form, e.g. by means of a system of clips that hold the shielded cover 16 pressed against the compliant conductive member 30.

Naturally, the invention is not limited to the embodiment described, but covers any variant coming within the ambit of the invention as defined by the claims.

It is stated above that the shielded cover comprises two half-shells. The shielded cover could be of shape and/or structure that are different. For example, the shielded cover could comprise a single half-shell that extends on one side of the primary circuit card, together with a shielded surface that extends over a face of the primary circuit card on its side where the half-shell is situated. The shielded surface then extends parallel to and facing the main face of the half-shell.

The half-shells and the shielded surface then once again form a rectangular shielded box that is open only via an empty open face.

The compliant conductive member does not necessarily comprise a foam, but could comprise some other material, e.g. a section member made of a resilient polymer that is solid and conductive, and of arbitrary section.

The primary connection device does not necessarily include a primary circuit card: by way of example, the primary conductive contacts could be constituted by wires of a cable or of a ribbon, with the shielded cover extending around the end of the cable or of the ribbon.

The invention claimed is:

1. An electrical connection system comprising a primary connection device and a secondary connection device arranged to be connected together, the primary connection device including a shielded cover and primary conductive contacts that extend at least in part inside the shielded cover, the secondary connection device comprising
a secondary electric circuit card presenting a secondary ground surface;
secondary conductive contacts that extend from an implantation surface of the secondary electric circuit card, the implantation surface being surrounded by the secondary ground surface; and
a compliant conductive member fastened on the secondary ground surface,
the electrical connection system being arranged in such a manner that, when the primary connection device and the secondary connection device are connected together, the primary conductive contacts are electrically connected to the secondary conductive contacts inside the shielded cover, the shielded cover extends over the compliant conductive member, and the shielded cover directly abuts and compresses the compliant conductive member.

2. The electrical connection system according to claim 1, wherein the compliant conductive member comprises a conductive foam.

3. An electrical equipment comprising an electrical connection system,
the electrical connection system comprising a primary connection device and a secondary connection device arranged to be connected together, the primary connection device comprising a shielded cover and primary conductive contacts that extend at least in part inside the shielded cover,
the secondary connection device comprising:
a secondary electric circuit card presenting a secondary ground surface;
secondary conductive contacts that extend from an implantation surface of the secondary electric circuit card, the implantation surface being surrounded by the secondary ground surface; and
a compliant conductive member fastened on the secondary ground surface,
the electrical connection system being arranged in such a manner that, when the primary connection device and the secondary connection device are connected together, the primary conductive contacts are electrically connected to the secondary conductive contacts inside the shielded cover, the shielded cover extends over the compliant conductive member, and the shielded cover directly abuts and compresses the compliant conductive member,
the electrical equipment further comprising a primary circuit connected to the primary connection device, and a secondary circuit connected to the secondary connection device.

4. The electrical connection system according to claim 1, wherein the primary connection device includes a primary electric circuit card carrying the primary conductive contacts and on which the shielded cover is fastened.

5. The electrical connection system according to claim 4, wherein the shielded cover comprises two half-shells, each extending on a respective side of the primary electric circuit card.

6. The electrical connection system according to claim 4, wherein the shielded cover comprises a half-shell that extends on one side of the primary electric circuit card, together with a shielded surface that extends over the primary electric circuit card facing a face of the half-shell.

7. The electrical connection system according to claim 4, wherein the primary conductive contacts extend parallel to the primary electric circuit card, the secondary conductive contacts extend orthogonally to the secondary electric circuit card, the primary electric circuit card and the secondary electric circuit card being arranged orthogonally relative to each other when the primary connection device and the secondary connection device are connected together.

8. The electrical connection system according to claim 4, wherein an edge of the primary electric circuit card includes at least one notch arranged in such a manner that, when the primary connection device and the secondary connection device are connected together, the edge of the primary electric circuit card bears against the secondary electric circuit card while limiting the extent to which the compliant conductive member is compressed by the edge.

9. A connection device comprising an electric circuit card, the electric card comprising:
an implantation surface;
conductive contacts that extend orthogonally to the electric circuit card from the implantation surface;
a ground surface that is a bare metal surface, the ground surface surrounding the implantation surface and the conductive contacts;
a compliant conductive member forming a rectangular profile, the compliant conductive member being fastened on the ground surface, the compliant conductive member surrounding the implantation surface and the conductive contacts.

* * * * *